US010573586B2

(12) United States Patent
Cook et al.

(10) Patent No.: US 10,573,586 B2
(45) Date of Patent: *Feb. 25, 2020

(54) PACKAGED SEMICONDUCTOR DEVICE HAVING PATTERNED CONDUCTANCE DUAL-MATERIAL NANOPARTICLE ADHESION LAYER

(71) Applicant: TEXAS INSTRUMENTS INCORPORATED, Dallas, TX (US)

(72) Inventors: Benjamin Stassen Cook, Addison, TX (US); Daniel Yong Lin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/913,648

(22) Filed: Mar. 6, 2018

(65) Prior Publication Data

US 2018/0240741 A1 Aug. 23, 2018

Related U.S. Application Data

(63) Continuation of application No. 15/437,580, filed on Feb. 21, 2017, now Pat. No. 9,941,194.

(51) Int. Cl.
*H01L 23/495* (2006.01)
*H01L 21/67* (2006.01)
(Continued)

(52) U.S. Cl.
CPC .... *H01L 23/49586* (2013.01); *H01L 21/4825* (2013.01); *H01L 21/4857* (2013.01);
(Continued)

(58) Field of Classification Search
CPC ............... H01L 23/49586; H01L 24/48; H01L 23/49517; H01L 23/49558;
(Continued)

(56) References Cited

U.S. PATENT DOCUMENTS 4,637,990 A 1/1987 Torobin
5,073,459 A 12/1991 Smarsly et al.
(Continued)

FOREIGN PATENT DOCUMENTS

EP 2924719 9/2015
WO 2008068873 A1 6/2008
(Continued)

OTHER PUBLICATIONS

International Search Report for PCT/US2017/066495 dated Apr. 5, 2018.
(Continued)

*Primary Examiner* — Syed I Gheyas
(74) *Attorney, Agent, or Firm* — Michael A. Davis, Jr.; Charles A. Brill; Frank D. Cimino

(57) ABSTRACT

Described examples include a substrate made of a first material and having a surface. First and second nozzles respectively dispense a first solvent paste including electrically conductive nanoparticles and a second solvent paste including non-conductive nanoparticles, while moving over the surface of the substrate. The first and second nozzles additively deposit a uniform layer including sequential and contiguous zones, alternating between the first solvent paste and the second solvent paste. Energy is applied to sinter together the nanoparticles and diffuse the nanoparticles into the substrate. The sintered nanoparticles form a layer composed of an alternating sequence of electrically conductive zones contiguous with electrically non-conductive zones.

14 Claims, 4 Drawing Sheets

(51) Int. Cl.
*H01L 21/48* (2006.01)
*H01L 21/56* (2006.01)
*H01L 23/29* (2006.01)
*H01L 23/00* (2006.01)

(52) U.S. Cl.
CPC .......... *H01L 21/4867* (2013.01); *H01L 21/56* (2013.01); *H01L 21/6715* (2013.01); *H01L 21/67121* (2013.01); *H01L 23/293* (2013.01); *H01L 23/49517* (2013.01); *H01L 23/49558* (2013.01); *H01L 23/49582* (2013.01); *H01L 24/48* (2013.01); *H01L 2224/48091* (2013.01); *H01L 2224/48245* (2013.01); *H01L 2224/48465* (2013.01); *H01L 2924/183* (2013.01); *H01L 2924/186* (2013.01)

(58) Field of Classification Search
CPC ........... H01L 23/49582; H01L 21/6715; H01L 21/67121; H01L 21/4825; H01L 23/293; H01L 21/4857
See application file for complete search history.

(56) References Cited

U.S. PATENT DOCUMENTS

| | | | |
|---|---|---|---|
| 5,682,075 | A | 10/1997 | Bolleman et al. |
| 6,107,216 | A | 8/2000 | Kennedy et al. |
| 6,330,916 | B1 | 12/2001 | Rickards et al. |
| 7,569,920 | B2 | 8/2009 | Otremba et al. |
| 7,589,439 | B2 | 9/2009 | Raisanen |
| 7,843,055 | B2 | 11/2010 | Bauer et al. |
| 8,178,976 | B2 | 5/2012 | Dunne et al. |
| 8,647,979 | B2 | 2/2014 | Yaniv et al. |
| 8,728,991 | B2 | 5/2014 | Wu et al. |
| 8,815,648 | B1 | 8/2014 | Aoya et al. |
| 9,236,169 | B2 | 1/2016 | Hong et al. |
| 9,305,869 | B1 | 4/2016 | Zhang et al. |
| 2002/0150821 | A1 | 10/2002 | Fukuda et al. |
| 2003/0134084 | A1 | 7/2003 | Ichikawa et al. |
| 2004/0110059 | A1 | 6/2004 | Onishi et al. |
| 2004/0137209 | A1 | 7/2004 | Zeller et al. |
| 2004/0161596 | A1 | 8/2004 | Taoka et al. |
| 2004/0214452 | A1 | 10/2004 | Freeman |
| 2005/0009353 | A1 | 1/2005 | Coomer et al. |
| 2005/0048758 | A1 | 3/2005 | Hosseini et al. |
| 2005/0109617 | A1 | 5/2005 | Ono et al. |
| 2006/0163744 | A1 | 7/2006 | Vanheusden et al. |
| 2006/0211802 | A1 | 9/2006 | Asgari |
| 2006/0266714 | A1 | 11/2006 | Olson, III et al. |
| 2006/0275649 | A1 | 12/2006 | Keller et al. |
| 2007/0001319 | A1 | 1/2007 | Bauer et al. |
| 2007/0087268 | A1 | 4/2007 | Kim et al. |
| 2007/0114138 | A1 | 5/2007 | Krasteva et al. |
| 2007/0145606 | A1 | 6/2007 | Mahler et al. |
| 2007/0163643 | A1 | 7/2007 | Van Duren et al. |
| 2007/0201122 | A1 | 8/2007 | Dozeman et al. |
| 2008/0081157 | A1 | 4/2008 | Schneegans et al. |
| 2008/0105853 | A1 | 5/2008 | Ueda et al. |
| 2008/0106853 | A1 | 5/2008 | Suenaga |
| 2008/0145607 | A1 | 6/2008 | Kajiwara et al. |
| 2008/0213611 | A1 | 9/2008 | Asgari |
| 2008/0272344 | A1 | 11/2008 | Jiang et al. |
| 2008/0286488 | A1 | 11/2008 | Li et al. |
| 2009/0020865 | A1 | 1/2009 | Su |
| 2009/0045907 | A1 | 2/2009 | Hoidis et al. |
| 2009/0047485 | A1 | 2/2009 | Ofir et al. |
| 2009/0096100 | A1 | 4/2009 | Kajiwara et al. |
| 2009/0189264 | A1 | 7/2009 | Yato et al. |
| 2009/0211638 | A1 | 8/2009 | Park et al. |
| 2009/0274833 | A1 | 11/2009 | Li et al. |
| 2010/0055302 | A1 | 3/2010 | Kim et al. |
| 2010/0155496 | A1 | 6/2010 | Stark et al. |
| 2010/0171064 | A1 | 7/2010 | Shim et al. |
| 2010/0187678 | A1 | 7/2010 | Kajiwara et al. |
| 2010/0196681 | A1 | 8/2010 | Song et al. |
| 2011/0124252 | A1 | 5/2011 | Shimomura et al. |
| 2011/0160104 | A1 | 6/2011 | Wu et al. |
| 2011/0209751 | A1 | 9/2011 | Nojiri et al. |
| 2011/0290863 | A1 | 12/2011 | Kajiwara et al. |
| 2011/0300305 | A1 | 12/2011 | Li et al. |
| 2012/0015147 | A1 | 1/2012 | Maa et al. |
| 2012/0061815 | A1 | 3/2012 | Sontheimer et al. |
| 2012/0089180 | A1 | 4/2012 | Fathi et al. |
| 2012/0115271 | A1 | 5/2012 | Holliman et al. |
| 2012/0119342 | A1 | 5/2012 | Chang Chien et al. |
| 2012/0144958 | A1 | 6/2012 | Olson, III et al. |
| 2012/0153216 | A1 | 6/2012 | Wrosch |
| 2012/0175147 | A1 | 7/2012 | Nakako et al. |
| 2012/0186644 | A1 | 7/2012 | Ko et al. |
| 2012/0251736 | A1 | 10/2012 | Hong et al. |
| 2013/0049204 | A1 | 2/2013 | Oeschler et al. |
| 2013/0136645 | A1 | 5/2013 | Sekine et al. |
| 2014/0048749 | A1 | 2/2014 | Lockett et al. |
| 2014/0120356 | A1 | 5/2014 | Shearer et al. |
| 2014/0131898 | A1 | 5/2014 | Shearer et al. |
| 2014/0166098 | A1 | 6/2014 | Kian et al. |
| 2014/0205918 | A1 | 7/2014 | Schuh et al. |
| 2014/0249058 | A1 | 9/2014 | Wu et al. |
| 2014/0264383 | A1 | 9/2014 | Kajiwara et al. |
| 2014/0284779 | A1 | 9/2014 | Hayata et al. |
| 2015/0069611 | A1 | 3/2015 | Martin et al. |
| 2015/0070752 | A1 | 3/2015 | Sadlik et al. |
| 2015/0123263 | A1 | 5/2015 | Frueh et al. |
| 2015/0173200 | A1 | 6/2015 | Kim et al. |
| 2015/0179478 | A1 | 6/2015 | Xiu et al. |
| 2015/0214095 | A1 | 7/2015 | Mischitz et al. |
| 2015/0217411 | A1 | 8/2015 | Ishikawa et al. |
| 2015/0243402 | A1 | 8/2015 | Cho et al. |
| 2016/0005671 | A1 | 1/2016 | Tsuyuno et al. |
| 2016/0093558 | A1 | 3/2016 | Cook et al. |
| 2016/0211083 | A1 | 7/2016 | Kanatzidis et al. |
| 2016/0256807 | A1 | 9/2016 | Gao et al. |
| 2016/0286654 | A1 | 9/2016 | Romig et al. |
| 2016/0372693 | A1 | 12/2016 | Kumaki et al. |
| 2016/0381844 | A1 | 12/2016 | Knox et al. |
| 2017/0004978 | A1 | 1/2017 | Hwang et al. |
| 2017/0011991 | A1 | 1/2017 | Khazaka |
| 2017/0012017 | A1 | 1/2017 | Khazaka et al. |
| 2017/0144221 | A1 | 5/2017 | Ghoshal et al. |
| 2017/0181291 | A1 | 6/2017 | Bell et al. |
| 2017/0213615 | A1 | 7/2017 | Okada et al. |
| 2017/0216923 | A1 | 8/2017 | Babenko et al. |
| 2017/0294397 | A1 | 10/2017 | Croteau et al. |
| 2017/0305743 | A1 | 10/2017 | Sekine et al. |
| 2017/0309549 | A1 | 10/2017 | Wachtler et al. |
| 2018/0138110 | A1 | 5/2018 | Cook |
| 2018/0166369 | A1 | 6/2018 | Cook et al. |
| 2018/0182693 | A1 | 6/2018 | Cook et al. |

FOREIGN PATENT DOCUMENTS

| | | |
|---|---|---|
| WO | 2009097627 A2 | 8/2009 |
| WO | 2014150089 A1 | 9/2014 |

OTHER PUBLICATIONS

International Search Report for PCT/US2017/068083 dated May 4, 2018.
International Search Report for PCT/US2017/061078 dated Mar. 15, 2018.
European Search Report for EU 17880180.9 dated Nov. 29, 2019.

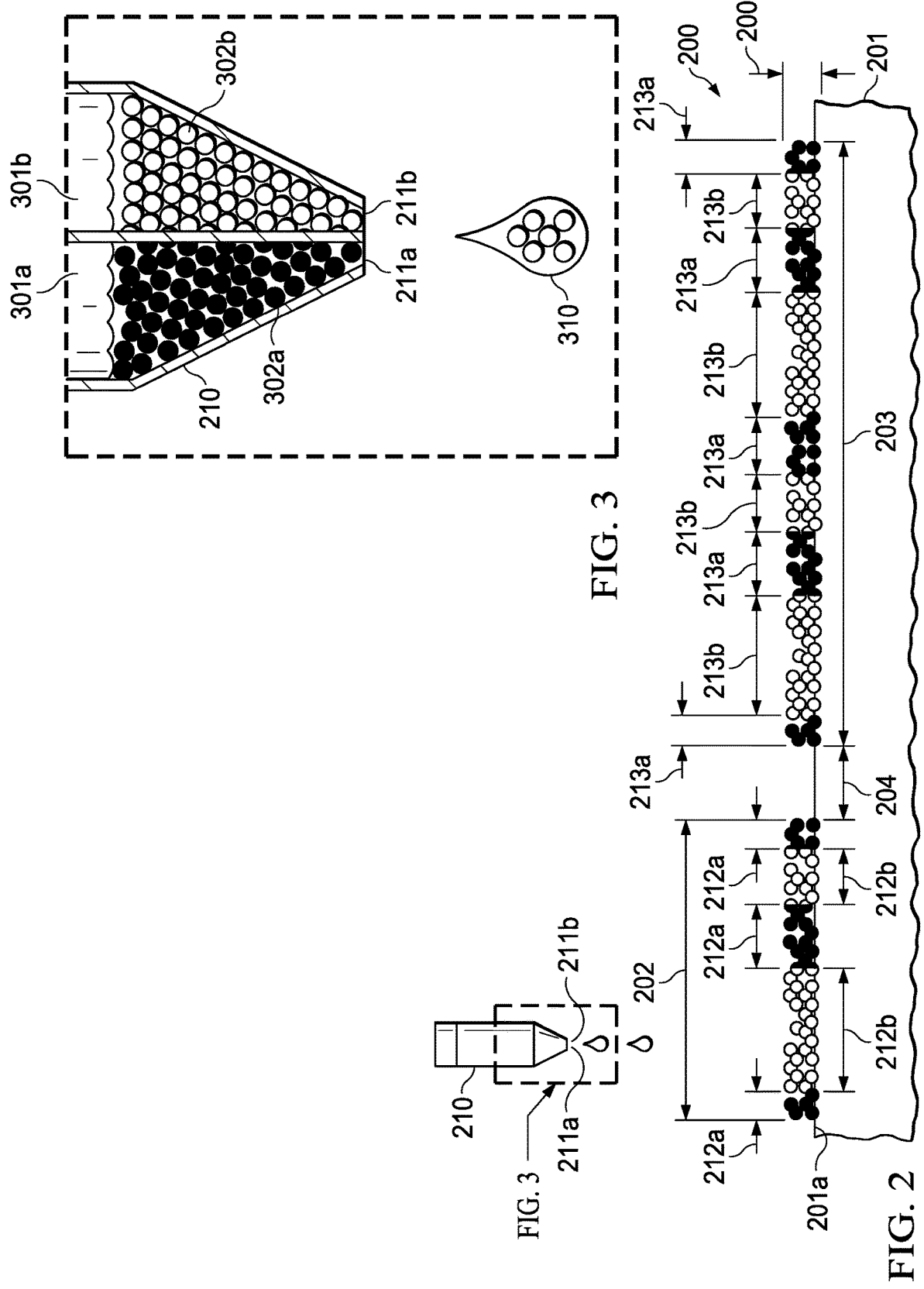

PACKAGED SEMICONDUCTOR DEVICE HAVING PATTERNED CONDUCTANCE DUAL-MATERIAL NANOPARTICLE ADHESION LAYER

CROSS-REFERENCE TO RELATED APPLICATION

This application is a continuation of U.S. patent application Ser. No. 15/437,580 filed Feb. 21, 2017, which is hereby fully incorporated herein by reference.

BACKGROUND

This relates generally to semiconductor devices and processes, and more particularly to structures and fabrication of packaged semiconductor devices having patterned conductance dual-material nanoparticle layers.

Based on their functions, semiconductor packages include a variety of different materials. Metals formed as leadframes are employed for mechanical stability, and electrical and thermal conductance. Insulators, such as polymeric molding compounds, are used for encapsulations. In packaging fabrication, it is common practice to attach a plurality of semiconductor chips to a strip of leadframe (or packaging substrate), to connect the chips to their respective leads, and then to encapsulate the assembled chips in packages. Packages protect the enclosed parts against mechanical damage and environmental influences such as moisture and light. After the encapsulation step, the package chips are separated from the leadframe strip (or packaging substrate) into discrete units by a trimming and forming step.

Today's semiconductor technology employs a number of methods to raise the level of adhesion between the diversified materials so that the package passes accelerated tests and use conditions without delamination. Among the efforts are chemically purifying the molding compounds, activating leadframe metal surfaces (such as by plasma just before the molding process), and enhancing the affinity of leadframe metals to polymeric compounds by oxidizing the base metal. Furthermore, design features such as indentations, grooves or protrusions, overhangs and other three-dimensional features are added to the leadframe surface for improved interlocking with the package material.

Another example of known technology to increase adhesion between leadframe, chip, and encapsulation compound in semiconductor packages, is the roughening of the whole leadframe surface by chemically etching the leadframe surface after stamping or etching the pattern from a metal sheet. Chemical etching is a subtractive process using an etchant. Chemical etching creates a micro-crystalline metal surface.

Yet another known method to achieve a rough surface is the use of a specialized metal plating bath, such as a nickel plating bath, to deposit a rough metal (such as nickel) layer. This method is an additive process; the created surface roughness is on the order of 1 to 10 µm. Roughening of the leadframe surface may have some unwelcome side effects. General roughening of the surface impacts wire bonding negatively. For example, vision systems have trouble seeing the roughened surface, the rough surface shortens capillary life; and micro-contaminants on the rough surface degrade bonding consistency. General rough surfaces tend to allow more bleeding, when the resin component separates from the bulk of the chip attach compound and spreads over the surface of the chip pad. The resin bleed, in turn, can degrade moisture level sensitivity and interfere with down bonds on the chip pad.

The success of all these efforts has only been limited, especially because the adhesive effectiveness is diminishing ever more when another downscaling step of device miniaturization is implemented.

SUMMARY

Described examples include a substrate made of a first material and having a surface. First and second nozzles respectively dispense a first solvent paste including electrically conductive nanoparticles and a second solvent paste including non-conductive nanoparticles, while moving over the surface of the substrate. The first and second nozzles additively deposit a uniform layer comprising sequential and contiguous zones, alternating between the first solvent paste and the second solvent paste. Energy is applied to sinter together the nanoparticles and diffuse the nanoparticles into the substrate. The sintered nanoparticles form a layer composed of an alternating sequence of electrically conductive zones contiguous with electrically non-conductive zones.

BRIEF DESCRIPTION OF THE DRAWINGS

FIG. 2 illustrates the formation a dual-material nanoparticle adhesion layer with patterned electrical conductance and non-conductance according to an embodiment.

FIG. 3 illustrates a syringe of an inkjet printer, wherein the syringe has a first nozzle for dispensing a first solvent paste including electrically conductive nanoparticles and a second nozzle for dispensing a second solvent paste including electrically non-conductive nanoparticles according to an embodiment.

DETAILED DESCRIPTION OF EXAMPLE EMBODIMENTS

Figure 1:
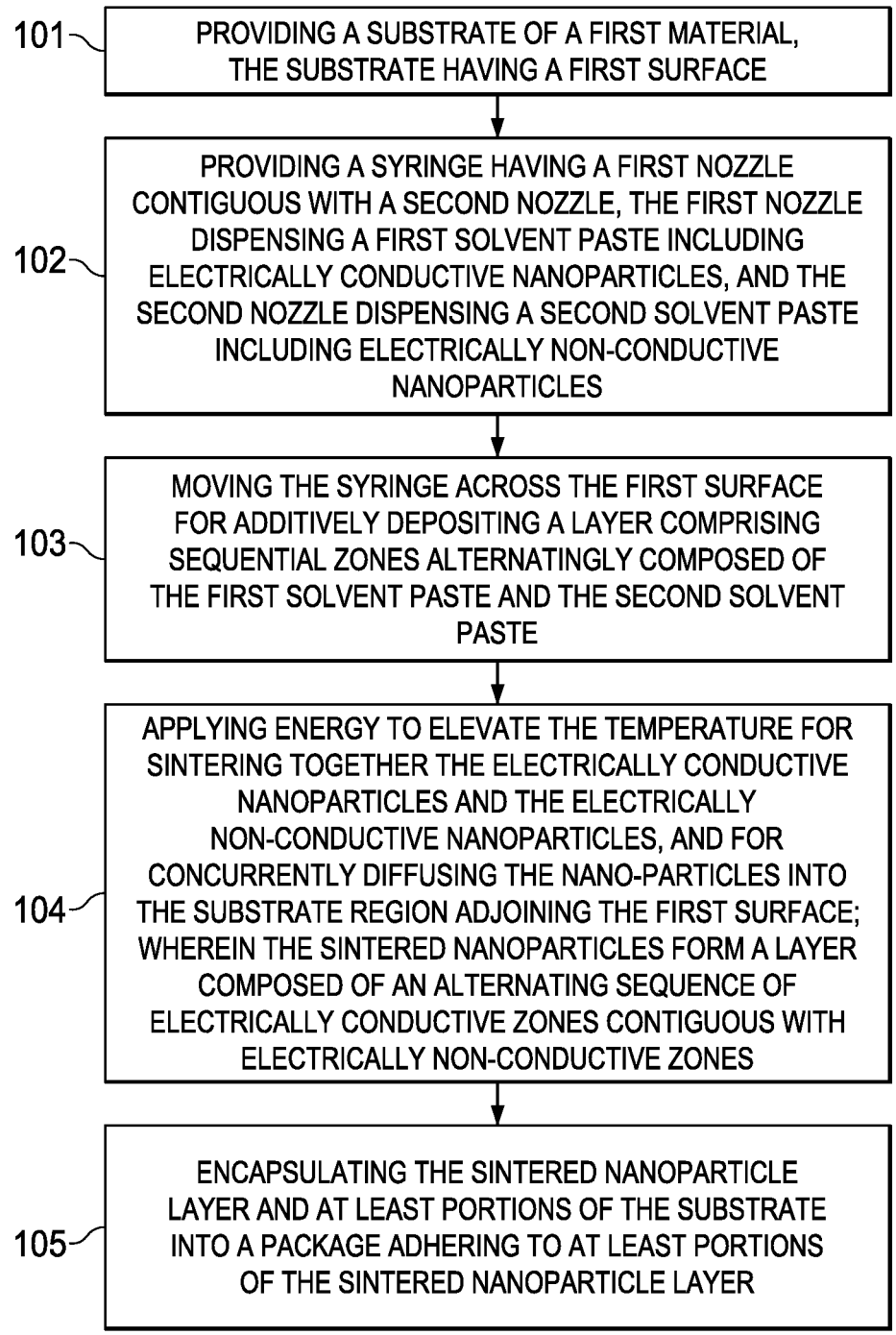
FIG. 1 is a flow diagram summarizing the process of creating a dual-material nanoparticle adhesion layer having zones with alternating electrical conductance and non-conductance according to an embodiment.

An embodiment includes a method for enhancing the adhesion and mechanical bonding between objects made of diverse materials such as metals and polymerics. The method comprises the formation and anchoring of an additive adhesion film composed of intermeshed nanoparticle layers between the objects. FIG. 1 is a diagram summarizing an embodiment. An object, onto which the additive film is constructed, is herein referred to as substrate, while another object, which needs adhesion to the substrate, is herein referred to as package. As examples, a substrate is denoted 201 in FIG. 2, and a package is denoted 501 in FIG. 5.

An application of the process flow shown in FIG. 1 can be applied to the fabrication technology of semiconductor devices. In semiconductor technology, the substrate usually is either a metallic leadframe or a laminated substrate composed of a plurality of alternating electrically insulating and electrically conductive layers. In step 101 of FIG. 1, a substrate is selected, which is made of a first material and has a surface extending in two dimensions; herein, the surface is referred to as first surface.

When the substrate is a leadframe (see FIG. 6 for example), such leadframe may be etched or stamped from a thin sheet of base metal such as copper, copper alloy, iron-nickel alloy, aluminum, Kovar™ and others, in a usual thickness range from 120 to 250 µm. As used herein, the term base metal has the connotation of starting material and does not imply a chemical characteristic. Some leadframes may have additional metal layers plated onto the complete or the partial surface areas of the base metal; examples are plated nickel, palladium, and gold layers on copper leadframes.

A leadframe provides a stable support pad (601 in FIG. 6) for positioning the semiconductor chip 610. Further, a leadframe provides conductive leads 603 to bring various electrical conductors into close proximity of the chip. Any remaining gap between the tip of the leads and the chip terminals is usually bridged by thin bonding wires 630. Alternatively, in flip-chip technology, the chip terminals may be connected to the leads by metal bumps. For the leadframe, the desired shape of pad, leads and other geometrical features are etched or stamped from the original metal sheet.

Besides chemical affinity between a molding compound and the metal finish of the leadframe, reliable adhesion may necessitate leadframe surface roughness. Also, the requirement to use lead-free solders pushes the reflow temperature range into the neighborhood of about 260° C., making it more difficult to maintain mold compound adhesion to the leadframes at elevated temperatures.

Referring to the process flow of FIG. 1, equipment for depositing solvent pastes is provided during step 102. Preferably, the equipment includes a computer-controlled inkjet printer with a moving syringe 210 with nozzle 211. An example is illustrated in FIG. 2. From the nozzle, discrete drops 310 of the paste are released. Automated inkjet printers can be selected from a number of commercially available printers. Alternatively, a customized inkjet printer can be designed to work for specific pastes. Alternatively, any additive method can be used including inkjet printing, screen printing, gravure printing, dip coating, spray coating, and many others. A number of different configurations are possible for syringes.

An example of a syringe and nozzles is depicted in FIG. 3. Syringe 210 is divided into two contiguous compartments. The first compartment is designated 301a, and the second compartment is designated 301b. The first compartment has a first nozzle 211a, and the second compartment has a second nozzle 211b. The compartments contain dispersants or solvents including nanoparticles. An example of solvent pastes, or dispersant pastes, is illustrated in FIG. 3. In the first compartment 301a, the nanoparticles 302a dissolved in the first dispersant paste are made of an electrically conductive material. In the second compartment 301b, the nanoparticles 302b are dissolved in a second dispersant paste and are electrically non-conductive.

The concept of nanoparticles as used herein includes spherical or other three-dimensional clusters composed of atoms or molecules, of inorganic or organic chemical compounds, of one-dimensional wires, of two-dimensional crystals and platelets, and of nanotubes. Furthermore, the surfaces of the nanoparticles may be functionalized against aggregation, or for improving the adhesion of the nanoparticles of the second material. Functionalization can be achieved by attaching ligand molecules to the core of the nanoparticles. Examples of hydrophobic ligand molecules include trioctylphosphine oxide (TOPO), triphenylphosphine (TPP), dodecanethiol (DDT), tetraoctylammonium bromide (TOAB), and oleic acid (OA). Examples of hydrophilic ligand molecules include mercaptoacetic acid (MAA), mercaptopropionic acid (MPA), mercaptoundecanoic acid (MUA), mercaptosuccinic acid (MSA), dihydrolipic acid (DHLA), bis-sulphonated triphenylphosphine (mPEG5-SH, mPEG45-SH), and short peptide of sequence CALNN.

The nanoparticles 302a may be selected from, but are not limited to, a group including metals, metal-coated polymers, metallized plastics, and metallized ceramics. The metals may include gold, silver, copper, aluminum, tin, zinc, and bismuth.

The nanoparticles 302b may be selected from, but are not limited to, a group including metal oxides, metal nitrides, metal carbides, ceramics, plastics, polymers, and conducting nanoparticles coated with oxides, polymers, ceramics, and other con-conducting compounds and molecules.

Referring to the process flow of FIG. 1, during step 103 of the process flow the syringe 210 of the deposition equipment is moved across the first surface 201a of substrate 201 in order to deposit additively a layer (designated 200 in FIG. 2) of the solvent pastes onto the surface 201a of substrate 201. The deposition is programmed so that the layer comprises sequential zones, which are alternatively composed of the first solvent paste with electrically conductive nanoparticles 302a and the second solvent paste with electrically non-conductive nanoparticles 302b. In this embodiment, the deposition is conducted so that layer 200 has uniform thickness 200a.

Screen printing, flexographic printing, gravure printing, dip coating, spray coating, and inkjet printing comprising piezoelectric, thermal, acoustic, and electrostatic inkjet printing are examples of processes that may be used to deposit the nanoparticles.

As depicted in FIG. 2, layer 200 may extend over the available surface area, or it may cover only portions of the surface area such as islands between about 0.1 µm to 100 µm dependent on the drop size of the solvent paste. Examples of a few islands are designated 202 and 203 in FIG. 2. In the separation 204 between the islands 202 and 203, there is no paste deposition with nanoparticles. When using metallic leadframes, layer 200 may cover the whole leadframe surface area of one or more leads, or selected parts such as the chip attach pad.

FIG. 2 illustrates an example of deposition of electrically conductive and electrically non-conductive nanoparticles, as deposited by a computer-controlled two-compartment syringe of the inkjet printer. In the example layer 200, the island of length 202 includes several zones 212a formed by the paste containing electrically conductive nanoparticles 302a. Zones 212a alternate with several zones 212b formed by the paste containing electrically non-conductive nanoparticles 302b. Zones 121b are contiguous with zones 212a, alternate with zones 212a, and have the same height 200a. Further included in layer 200 is the island of length 203, which includes several zones 213a formed by the paste containing electrically conductive nanoparticles 302a, and, contiguous with zones 213a, the zones 213b formed by the paste containing electrically non-conductive nanoparticles 302b.

Figure 4:
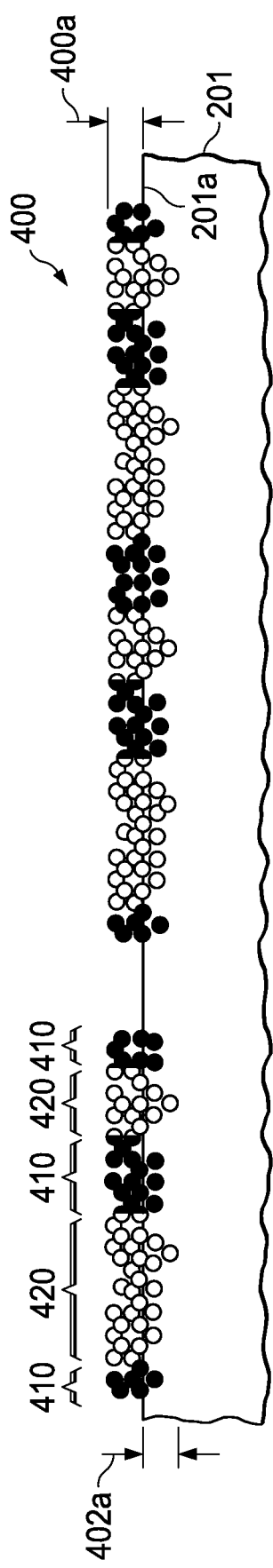
FIG. 4 depicts the dual-material nanoparticle adhesion layer after sintering and after the concurrent diffusion of molecules of the dual-material into substrate according to an embodiment.

During step 104 of the process flow of FIG. 1, energy is provided to increase the temperature for sintering together the nanoparticles 302a and 302b. The needed energy may be provided by a plurality of sources: thermal energy, photonic energy, electromagnetic energy, and chemical energy. When melting nanoparticles of a volume are sintering together, they may form necking connections, where the surfaces of the molten particles exhibit a constricted range resembling a neck between the volumes. As indicated in FIG. 4, the sintering process forms a layer 400 on surface 201a, which is composed of an array with alternating sequence of contiguous zones 410 of necked-together electrically conductive nanoparticles and zones 420 of necked-together electrically non-conductive nanoparticles. Zones 410 contain sintered nanoparticles 302a that are electrically conductive and zones 420 contain sintered nanoparticles 302b that are electrically non-conductive. The layer 400 has a substantially uniform height 400a. After the sintering process, the substrate surface has a dual-material nanoparticle adhesion layer with a patterned electrical conductance Concurrent with the sintering process is a diffusion process. During this diffusion process, nanoparticles 302a and 302b diffuse into the surface 201a. This diffusion process is based on atomic interdiffusion that creates an interdiffusion bond. Due to the diffusion into the substrate, the sintered nanoparticles 302a and 302b are anchored to the surface of the substrate.

Figure 5:
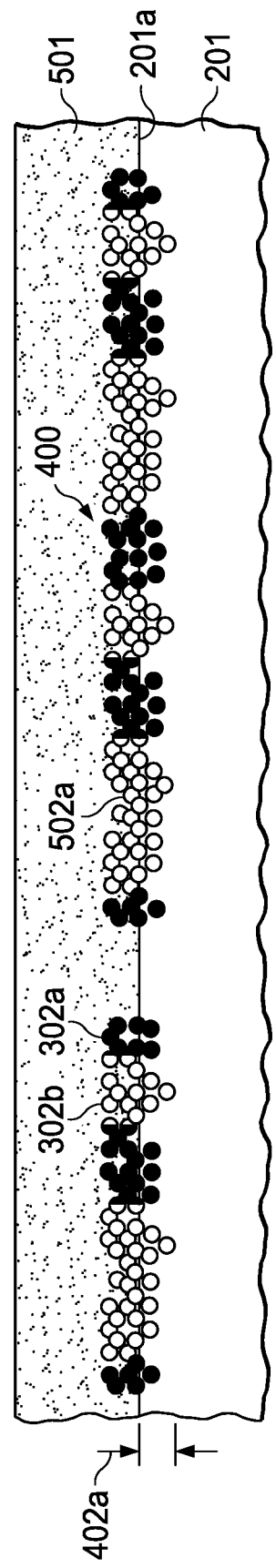
FIG. 5 shows the encapsulation of the dual-material nanoparticle adhesion layer by a packaging compound according to an embodiment.

During step 105 of the process flow shown in FIG. 1, the patterned conductivity dual-material nanoparticle adhesion layer 400, together with at least portions of the substrate 201 of first material are encapsulated into a package of polymeric compound. The process is illustrated in FIG. 5, wherein the polymeric compound is denoted 501. An example method for encapsulation by a polymeric compound is the transfer molding technology using a thermoset epoxy-based molding compound. Because the compound has low viscosity at the elevated temperature during the molding process, the polymeric compound can readily fill any voids 502a in the layer 400 of third material. The filling of the voids by polymeric material takes place for any voids, whether they are arrayed in an orderly pattern or in a random distribution, and whether they are shallow or in a random three-dimensional configuration including voids resembling spherical caverns with narrow entrances.

After the compound has polymerized and has cooled to ambient temperature, the polymeric compound 501 in the package as well as in the voids has hardened. After hardening of the plastic material, the polymeric-filled voids provide a bond between the package and the nanoparticle layer 400. Also, as described hereinabove, layer 400 is bonded to substrate 201 by metal interdiffusion 402a. As an overall result, the dual-material nanoparticle layer improves the adhesion between the plastic package 501 and the metallic substrate 201.

Figure 6:
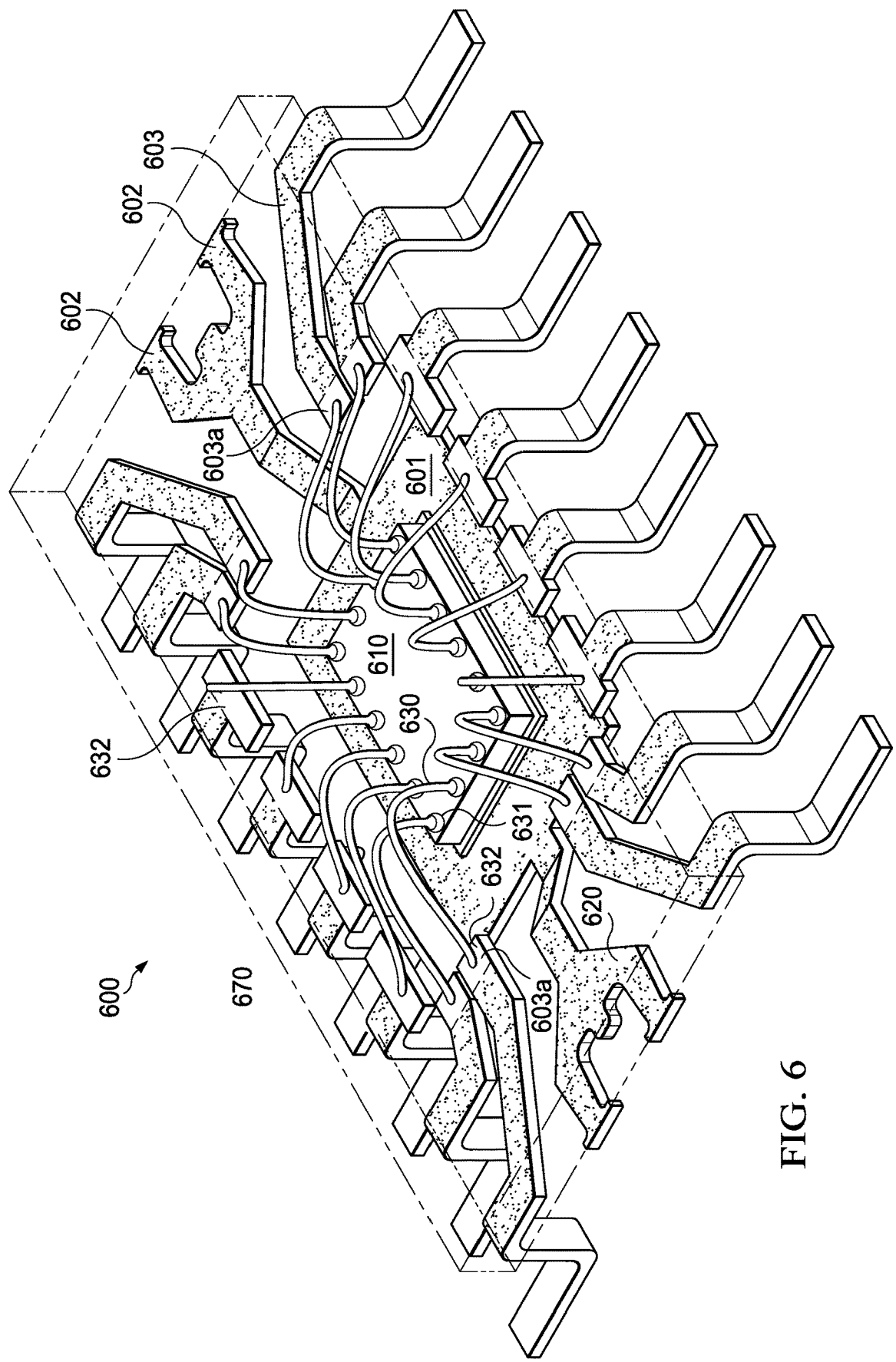
FIG. 6 illustrates a packaged semiconductor device with leadframe, wherein portions of the leadframe are covered by a dual-material nanoparticle adhesion layer having patterned electrical conductance and non-conductance according to an embodiment.

FIG. 6 illustrates an embodiment of adhesion by a nanoparticle adhesion layer patterned into zones of electrical conductance and insulation. The device includes a metallic leadframe and a plastic package. The embodiment includes a semiconductor device 600 with a leadframe including a pad 601 for assembling a semiconductor chip 610, tie bars 602 connecting pad 601 to the sidewall of the package, and a plurality of leads 603. The chip terminals are connected to the leads 603 by bonding wires 630, which commonly include ball bond 631 and stitch bond 632. In the example of FIG. 6, leads 603 are shaped as cantilevered leads; in other embodiments, the leads may have the shape of flat leads as used in quad flat no-lead (QFN) devices or in small outline no-lead (SON) devices. Along their longitudinal extension, tie bars 602 of the example device in FIG. 6 include bendings and steps, because pad 601 and leads 603 are not in the same plane. In other devices, tie bars 602 are flat and planar, because pad 601 and leads 603 are in the same plane.

In FIG. 6, the portions of the leadframe which are included in the zones of electrical non-conductance of the nanoparticle adhesive layer (realized for example by copper oxide) are marked by dashing 620. The leadframe portions 603a included in the zones of electrical conductance are free of dashing. Because the example device 600 includes a package 670 for encapsulating chip 610 and wire bonds 630, any voids of the patterned layer are filled by the polymeric compound. Package 670 may be made of a polymeric compound such as an epoxy-based thermoset polymer, formed in a molding process, and hardened by a polymerization process. The adhesion between the polymeric compound of package 670 and the leadframe is improved by the patterned nanoparticle layer. Other devices may have more and larger areas of the leadframe covered by the dual-material nanoparticle adhesion layer.

Modifications are possible in the described embodiments, and other embodiments are possible, within the scope of the claims.

What is claimed is:

1. A method of substrate modification, the method comprising:
    from a first nozzle, dispensing a first solvent paste including electrically conductive nanoparticles, the electrically conductive nanoparticles consisting essentially of a first material;
    from a second nozzle, dispensing a second solvent paste including electrically insulative nanoparticles, the electrically insulative nanoparticles consisting essentially of a second material;
    moving the first and second nozzles to additively deposit a layer on a substrate, the layer comprising sequential and contiguous zones alternatingly having the first solvent paste and the second solvent paste, the substrate consisting essentially of a third material; and
    applying energy to sinter together the electrically conductive nanoparticles, to sinter together the electrically insulative nanoparticles, and to diffuse at least a portion of the layer into the substrate, the sintered nanoparticles forming an alternating sequence of electrically conductive zones contiguous with electrically insulative zones.

2. The method of claim 1, wherein the third material is selected from a group including laminated substrate and metallic leadframe.

3. The method of claim 1, wherein the first material is selected from a group including metal nanoparticles, metal-coated polymeric nanoparticles, metal-coated ceramic nanoparticles, and metal-coated plastic nanoparticles.

4. The method of claim 1, wherein the second material is selected from a group including metal oxides nanoparticles, polymeric compound nanoparticles, nitrogen compound nanoparticles, and electrically conducting nanoparticles coated with polymerics, oxides, and carbon compounds.

5. The method of claim 1, wherein moving the first and second nozzles to additively deposit the layer includes a process selected from a group including screen printing, flexographic printing, gravure printing, dip coating, spray coating, and inkjet printing comprising piezoelectric, thermal, acoustic, and electrostatic inkjet printing.

6. The method of claim 1, wherein the energy is selected from a group including thermal energy, photonic energy, electromagnetic energy, and chemical energy.

7. A method of enhancing adhesion of packaged semiconductor devices, the method comprising:
   from a first nozzle, dispensing a first solvent paste including electrically conductive nanoparticles, the electrically conductive nanoparticles consisting essentially of a first material;
   from a second nozzle, dispensing a second solvent paste including electrically insulative nanoparticles, the electrically insulative nanoparticles consisting essentially of a second immaterial;
   moving the first and second nozzles to additively deposit a layer on a substrate, the layer comprising sequential and contiguous zones alternatingly having the first solvent paste and the second solvent paste, the substrate consisting essentially of a third material;
   applying energy to sinter together the electrically conductive nanoparticles, to sinter together the electrically insulative nanoparticles, and to diffuse at least a portion of the layer into the substrate, the sintered nanoparticles forming an alternating sequence of electrically conductive zones contiguous with electrically insulative zones; and
   with an encapsulation material, encapsulating the sintered nanoparticles and at least a portion of the substrate, at least a portion of the encapsulation material adhering to at least a portion of the sintered nanoparticles.

8. The method of claim 7, wherein the third material is selected from a group including laminated substrate and metallic leadframe.

9. The method of claim 8, wherein the substrate is a metallic leadframe and the third material is selected from a group including copper, copper alloys, aluminum, aluminum alloys, iron-nickel alloys, and Kovar™.

10. The method of claim 9, wherein the third material includes a plated layer of a metal selected from a group including tin, silver, nickel, palladium, and gold.

11. The method of claim 7, wherein the encapsulation material includes a polymeric compound.

12. The method of claim 7, wherein the first material is selected from a group including metal nanoparticles, metal-coated polymeric nanoparticles, metal-coated ceramic nanoparticles, and metal-coated plastic nanoparticles.

13. The method of claim 7, wherein the second material is selected from a group including metal oxides nanoparticles, polymeric compound nanoparticles, nitrogen compound nanoparticles, and electrically conducting nanoparticles coated with polymerics, oxides, and carbon compounds.

14. The method of claim 7, wherein the encapsulating includes encapsulating a semiconductor circuit chip on the substrate.

* * * * *